United States Patent [19]

Dalal et al.

[11] Patent Number: 5,634,268
[45] Date of Patent: Jun. 3, 1997

[54] METHOD FOR MAKING DIRECT CHIP ATTACH CIRCUIT CARD

[75] Inventors: Hormazdyar M. Dalal, Milton; Kenneth M. Fallon, Vestal; Gene J. Gaudenzi, Purdys, all of N.Y.

[73] Assignee: International Business Machines Corporation, Armonk, N.Y.

[21] Appl. No.: 476,466

[22] Filed: Jun. 7, 1995

[51] Int. Cl.[6] .................................................. H05K 3/34
[52] U.S. Cl. ........................ 29/840; 29/852; 228/180.22
[58] Field of Search .............................. 29/840, 852, 853, 29/841; 228/180.22; 437/183; 361/760, 768, 777; 257/737, 738

[56] References Cited

U.S. PATENT DOCUMENTS

| | | | |
|---|---|---|---|
| 4,685,210 | 8/1987 | King et al. | 24/852 |
| 4,967,950 | 11/1990 | Legg et al. | 228/180.2 |
| 4,999,699 | 3/1991 | Christie et al. | 357/65 |
| 5,075,965 | 12/1991 | Carey et al. | 29/840 |
| 5,130,779 | 7/1992 | Agarwala et al. | 357/67 |
| 5,251,806 | 10/1993 | Agarwala et al. | 228/180.22 |
| 5,261,543 | 11/1993 | Casson et al. | 228/180.22 |
| 5,421,083 | 6/1995 | Suppelsa et al. | 29/852 |
| 5,439,162 | 8/1995 | George et al. | 228/180.22 |

FOREIGN PATENT DOCUMENTS

| | | |
|---|---|---|
| 0568995 | 11/1993 | European Pat. Off. . |
| 62-117346 | 5/1987 | Japan ........................ H01L 21/92 |

OTHER PUBLICATIONS

W. A. Dawson et al., "Indium–Lead–Indium Chip Joining", IBM Technical Disclosure Bulletin, vol. 11, No. 11, Apr. 1969, p 1528.

*Microelectronics Packaging Handbook*, edited by Rao R. Tummala & Eugene J. Rymaszewski, SR28–4413–00, pp. 366–391.

*Primary Examiner*—Larry I. Schwartz
*Assistant Examiner*—Adrian L. Coley
*Attorney, Agent, or Firm*—Aziz M. Ahsan

[57] ABSTRACT

A structure and a method is disclosed for making a laminated circuit carrier card for the purpose of making a Direct Chip Attached Module (DCAM) with low cost and high reliability. The carrier is made using an organic or an inorganic laminated carrier having at least one surface available for direct chip mount. The chip has at least one solder ball with a cap of low melting point metal. The surface of the carrier has electrical features that are directly connected to the low melting point metal on the solder ball of the chip to form the eutectic and this way the chip is directly attached to the carrier.

36 Claims, 2 Drawing Sheets

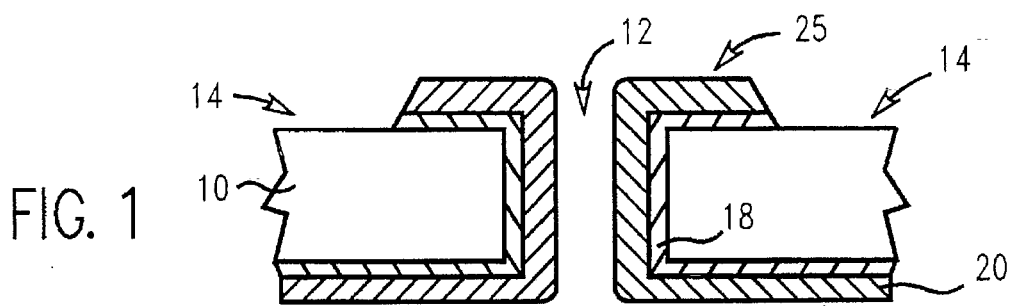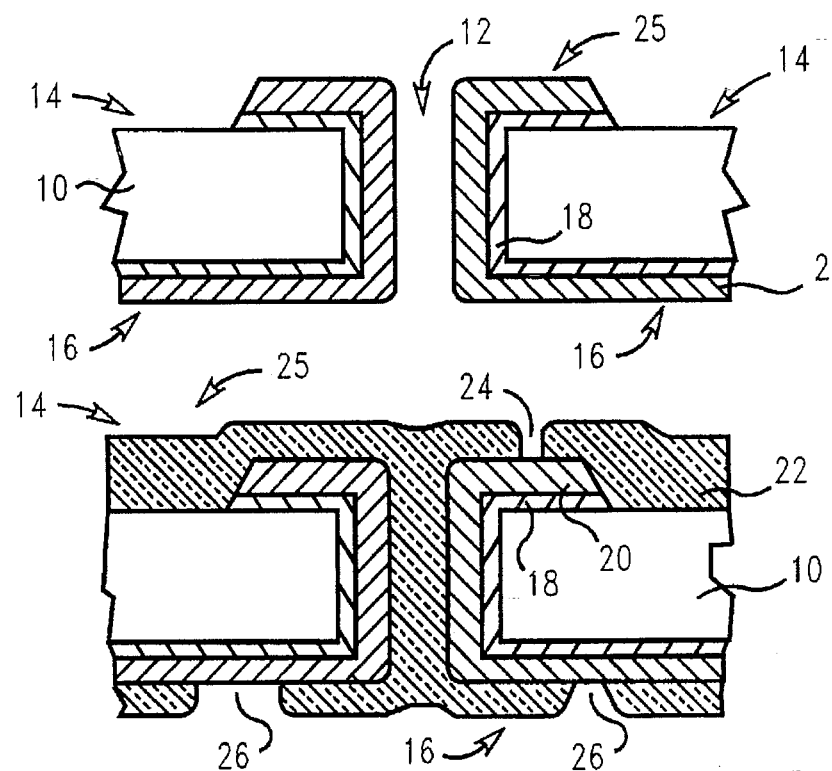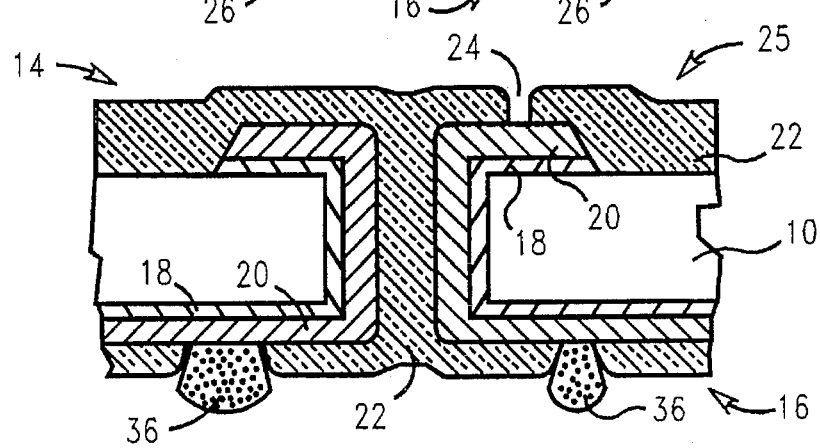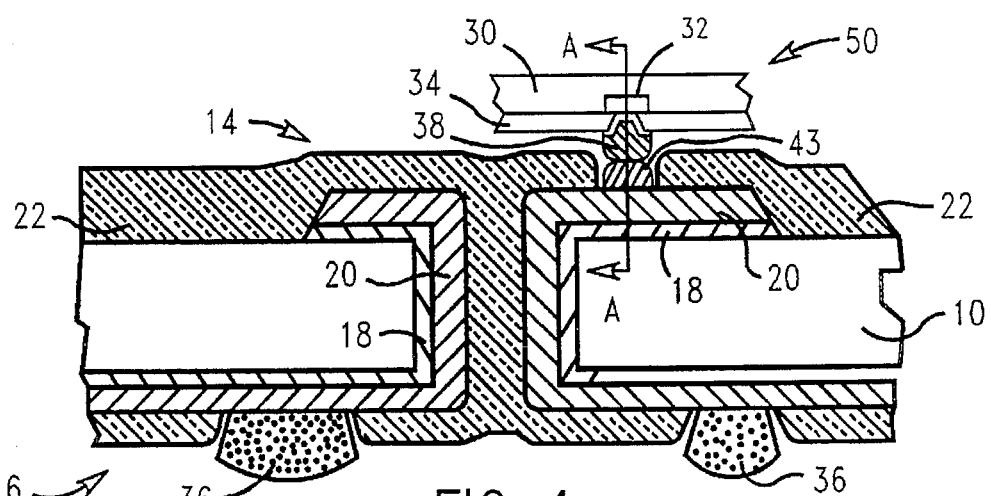

METHOD FOR MAKING DIRECT CHIP ATTACH CIRCUIT CARD

CROSS-REFERENCE TO RELATED PATENT APPLICATIONS

This Patent Application is related to U.S. patent application Ser. No. 08/476,475, entitled, "METHOD FOR FORMING REFLOWED SOLDER BALL WITH LOW MELTING POINT METAL CAP", filed on Jun. 7, 1995, U.S. patent application Ser. No. 08/476,474, entitled, "REFLOWED SOLDER BALL WITH LOW MELTING POINT METAL CAP", filed on Jun. 7, 1995, and U.S. patent application Ser. No. 08/476,472, entitled, "DIRECT CHIP ATTACH CIRCUIT CARD", filed on Jun. 7, 1995, all of which are presently assigned to the assignee of the instant application and the disclosures of which are incorporated herein by reference.

1. Field of the Invention

The present invention relates generally to an improved direct chip attach card. More particularly, the invention encompasses a structure where at least one Integrated Circuit Chip can be directly attached to an organic laminated circuit card. This direct attachment can be done by using solder ball technology and by capping the already reflowed solder balls on the chip with at least one capping layer of low melting point metal, such as, tin. A method for such direct chip attachment to the circuit card is also disclosed.

2. Background of the Invention

Semiconductor devices are becoming smaller and more dense with the evolution of new technology. However, increases in circuit density produce a corresponding challenge to improve chip and chip connections in order to remain competitive. Chip manufacturers are therefore constantly challenged to improve the quality of their products by identifying and improving their products. Whereas significant process improvements are being made by reducing process variability. Process improvements alone are not sufficient to increase both yield and reliability of these products.

Electronic products typically comprise of plurality of components. The packaging of these components follow a hierarchy where an Integrated Circuit (IC) chip comprising of semiconductor micro-devices are connected (1st level assembly) to carriers made of ceramic or organic laminates comprising one or several layers of metal interconnection lines. These carriers may also contain some other discrete devices like capacitors, resistors etc.. Thus assembled carriers with IC chips, along with some kind of sealing and cooling methodology, are called modules. These modules, in turn, are connected to cards (2nd level assembly) usually made of organic laminates with printed circuits on either side of the card. These cards are then connected to boards (3rd level assembly). The number of assembly levels depends mostly on complexity of functions required.

There are three primary 1st level, or chip-level, interconnection technologies, viz., Wire Bonding (WB), Tape Automated Bonding (TAB) and Solder Bonding (SB), such as, for example, C4 (Controlled Collapse Chip Connection).

A number of products presently in the market typically eliminate the first level package by bonding, the chips directly onto the card or board. This provides smaller, simpler and lower cost package. For low cost products, the most common method of connecting chips directly on card has been the Wire Bonding (WB) technique. The Tape Automated Bonding (TAB) has now come to wider use for directly attaching chip on card (or board) because TAB by itself is considered to be the 1st level assembly; secondly, because of its mechanical flexibility, it is suitable for chip mounting on flexible circuit carriers.

However, with the emergence of Very Large Scale and Ultra Large Scale Integrated Circuit chips, the number of Input/Output (I/O) terminals on a chip have grown so large that not only a close spacing of I/O pads is required but also an array pattern of I/O pads is required.

The requirement of array pattern renders wire bonding and TAB methods inapplicable.

Another limiting factor for use of these methods is difficulty in testing and/or burning-in of these mounted chips; this limits the card yield thus making the product expensive.

Yet another shortcoming is that rework is economically unfeasible.

These limitations necessitates use of a C4 like technology for joining chips directly on card.

The C4 or Controlled Collapse Chip Connection technology has been successfully employed for 1st level assembly of chip on ceramic carriers. The C4 technology is described in detail by many authors, see for example, Microelectronics Packaging Handbook, edited by, Rao R. Tummala and Eugene J. Rymaszewski, pages 366–391 (1989), the disclosure of which is incorporated herein by reference.

The C4 interconnection is comprised of two main elements, a solder reflowable pad called Ball Limiting Metallurgy (BLM), and a ball of solder. The BLM is comprised of an adhesive layer like Cr or TiW, and a solder reflowable layer like copper or nickel. The BLM materials and their thicknesses are judiciously chosen to provide good and reliable electrical, mechanical and thermal stability to interconnect structure. The solder material used for C4 is preferably a low percentage (about 2 percent to about 10 percent) tin alloyed with lead. This combination was initially used to prevent melting of the reflowed solder ball or C4 during the next level of interconnection but now it is mostly used:

(i) to reduce reaction between copper of BLM and tin, as high stresses resulting from excessive copper-tin intermetallic imparts a high stress concentration on underlaying passivation, and, (ii) for better thermal fatigue characteristic offered by lower Sn percentage.

Presently, there are two problems that limit the use of current C4 technology for 2nd or higher level assembly, i.e., for Direct Chip Attach (DCA) on card. First, it limits the 2nd level interconnection to Pin-Through-Hole (PTH) technology and precludes the use of cost effective, space saving Surface Mount technology (SMT), because a joining temperature higher than melting point of the SMT solder is required. Second, the relatively high joining temperature (340° C.–380° C.) will char the card organics.

There are two ways to lower the joining temperature for DCA. One approach is to provide an eutectic (or lower melting) solder on a card metallization. A method pertaining to this approach is described in U.S. Pat. No. 4,967,950 to Legg and Schrottke, which is presently assigned to the assignee of the instant patent application. Legg and Schrottke describes a general scheme for attaching circuit chips to flexible substrate (laminate) using C-4s. The substrate is "tinned" with an alloy of eutectic composition in its contact region with the solder balls on the base of the chip.

The method of pre-coating the card, or an organic carrier, by eutectic solder is taught by Fallon et al., U.S. patent application Ser. No. 08/387,686, entitled "Process for Selective Application of Solder to Circuit Packages", filed on Feb. 13, 1995, the disclosure of which is incorporated herein by reference. In this method, eutectic solder is electroplated on copper conductors of printed circuit card precisely where the Chip C4 bumps would make contact.

A second approach for lowering the joining temperature for Direct Chip Attach (DCA), is to provide a low melting solder on chip C4 rather than on the carrier conductor. Carey et al., in U.S. Pat. No. 5,075,965 and Agarwala et al., in U.S. Pat. Nos. 5,251,806 and 5,130,779, which are presently assigned to the assignee of the instant patent application, and, Japanese Patent Publication No. 62-117346 to Eiji et al., describe various schemes to provide low melting solder on chips.

Carey et al., in U.S. Pat. No. 5,075,965, disclose a method, where an inhomogeneous, anisotropic column consists of lead rich bottom and tin rich top of sufficient thickness to form eutectic alloy. The resulting as-deposited and un-reflowed column is then joined onto the card's conductor.

To circumvent the thermodynamically driven tendency for interdiffusion, Agarwala et al., in U.S. Pat. Nos. 5,251,806 and 5,130,779, showed a structure where the low melt component is separated from the high melt component by interposing a barrier metal layer. This structure does show a hierarchy of solder material, however, in this structure the column of high melting solder never get reflowed. Because, the stacked solder does not get reflowed there is no metallurgical reaction between the solder stack and the adhesive pad of Ball Limiting Metallurgy (BLM) which is known to cause poor mechanical integrity of the C4 joint.

Eiji et al., in Japanese Patent Publication No. 62-117346, describe an anisotropic column structure of low and high melting solders. The basic objective of this invention is essentially to provide an increase height of a solder joint rather than to provide a low melting solder joining process. In Eiji et al., a high-melting point metallic layer is secured to a chip and a substrate and a low-melting point metallic layer is then formed. The two low-melting point metallic layers are then joined and thereby the chip is joined to the substrate.

IBM Technical Disclosure Bulletin, entitled "Indium-Lead-Indium Chip Joining", W. A. Dawson et al., Vol. 11, No. 11, page 1528 (April 1969), discloses the standard capping of lead with either indium or tin for diffusion bonding. In order to alleviate the problem of chip collapse onto the surface of the substrate an intermediate temperature is employed.

For the purposes of this invention a bump completely composed of low melting composition is a feature to be avoided as the high tin content reacts with all of the copper of the adhesive layer (Ball Limiting Metallurgy, BLM) giving a thick intermetallic layer. High stresses of reacted BLM have been known to cause solder pads to fall off and to create insulation cracking. The eutectic solder bumps also have poor electromigration and thermal fatigue lifetime. It is also known that low melting eutectic solder suffers from void formation due to thermal migration which causes circuit failure.

Yet another drawback of inhomogeneous, anisotropic solder column is that this structure is unfavorable for electrical tests of circuitry before joining the chips on carriers as the electrical probes gouge into the low melt cap during testing and destroy the cap. Furthermore, for the chip burn-in it is also not feasible to use any of the known multi-layered solder balls, as the temperature that is generally used is between 120° –150° C. for burn-in which will cause inter diffusion of the low and the high melt components even before the joining operation begins.

This invention relates generally to interconnection in electronic circuit packages, and more particularly to a new solder interconnection technology to make a Direct Chip Attached Module by joining IC chip with Tin Capped solder C4 ball to an organic laminated circuit carrier prepared by this invention.

According to the present invention a method is provided for making an organic laminated circuit card, or interposer, for IC chip joining and having temperature compatibility for joining to next level of packaging through Surface Mount Technology or Solder Ball Technology.

The invention also relates to providing a reliable metallurgical system for joining a IC chips on rigid or flexible organic microelectronic circuit cards at low temperatures in order to be compatible with the low temperature processing requirement of the organic cards; and, also to be compatible with Surface Mount or Solder Ball Connect Technologies generally used for higher level interconnections.

PURPOSES AND SUMMARY OF THE INVENTION

The invention is a novel method and structure for providing direct chip attach to a circuit card using a novel solder interconnection scheme.

Accordingly, it is a purpose of the present invention to provide a method of making organic laminated circuit cards for direct chip attachment using a novel solder interconnection scheme.

It is another purpose of the present invention to build a Direct Chip Attached Module, comprised of Tin capped C4 interconnection IC chips attached on above processed organic laminated circuit cards by C4 technology, which is compatible with Surface Mount Technology for next level of assembly.

It is yet another purpose of the present invention to provide an individual chip Joining method for direct chip attach on rigid or flexible organic circuit carriers.

It is a further purpose of the present invention to provide a method of directly attaching an IC chip onto a motherboard and having flexibility to remove and replace a chip.

Another purpose of this invention is to provide for a semiconductor module that is low cost and easy to build.

Yet another purpose of the present invention to provide a low melting interconnection metallurgy on IC chips.

Still yet another purpose of this invention is to have a semiconductor module which is capable of undergoing several joining cycles.

Yet another purpose of this invention is to increase the yield and have a joint that has high reliability.

Still yet another purpose of the invention is to have a module that is compatible with wafer level electrical test and burn-in.

Therefore, in one aspect this invention comprises a method of making a device carrier for directly attaching a device having reflowed solder balls with low melting point metal cap, said method comprising the steps of:

(a) making at least one opening in a substrate, (b) depositing at least one electrically conductive metal on at least one surface of said substrate, and lining at least a portion of said opening with said at least one electrically conductive metal, (c) photolithographically defining a circuit pattern on at least a portion of said substrate, (d) forming said photolithographically defined circuit pattern on at least a portion of said substrate, (e) coating at least a portion of said substrate with at least one insulator material and filling said opening with said insulator material, (f) removing a portion of said insulator material and exposing a portion of said circuit pattern, and (g) joining a device having said reflowed solder balls with at least one low melting point metal cap to said exposed circuit pattern, such that at least a portion of said cap joins to a portion of said exposed circuit pattern.

In another aspect this invention comprises an electronic card structure comprising a device carrier and at least one device electrically connected thereto by at least one solder ball, wherein said solder ball has a cap of at least one low melting point material forming a eutectic.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows taken in conjunction with the accompanying drawings in which:

FIG. 1, illustrates a cross-sectional view of a conventional substrate after the lamination operations, and circuitization on both surfaces have been completed.

FIG. 2, shows a cross-sectional view of the circuit card of FIG. 1, after the top surface, bottom surface and the via holes have been coated with at least one layer of photosensitive insulator material, and openings in the insulator material are defined photolithographically.

FIG. 3, illustrates the circuit card after at least one eutectic solder coating has been formed for the SMT pads.

FIG. 4, illustrates a cross-sectional view of the inventive structure showing a Direct Chip Attached Module where an IC chip having low melting point metal capped solder balls has been directly joined to the circuit card in a single step.

DETAILED DESCRIPTION OF THE INVENTION

Figure 5:
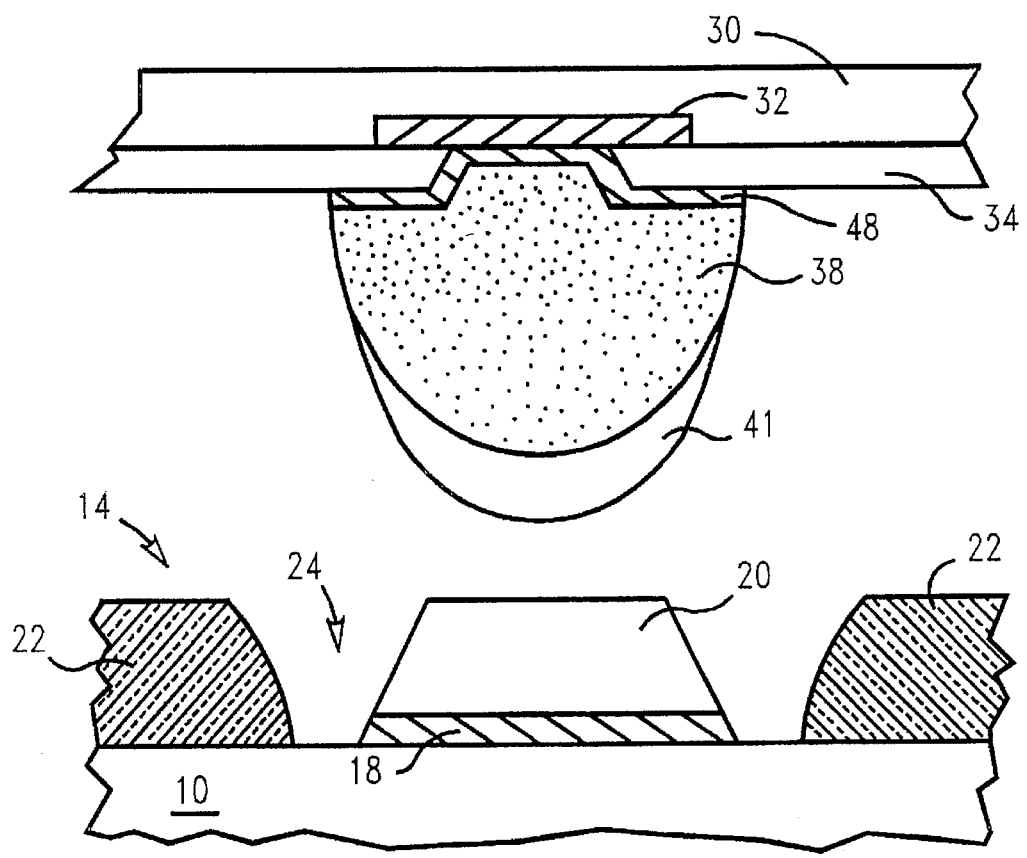
FIG. 5, is an enlarged cross-sectional view taken prior to the joining of an IC chip having a cap of low melting point metal on a solder ball to the circuit card.

The invention basically encompasses a circuit carrier comprised of laminated organic insulator with metallic conductor lines, such as, copper. Openings are made at sites which will be electrically connected to the device having the reflowed solder ball with the cap. Ashing of the surface of the device carrier could also be done to improve the adhesion and the flow of device encapsulants. Solder paste could also be screened onto the backside of the laminated panels and reflowed, such as, by using Infra Red heating for the purposes of next level of connection using surface mount technology (SMT).

Also disclosed is the formation of a direct chip attach module (DCAM). This is done by aligning the solder balls with the cap of low melting point metal on the chip with the corresponding footprints on the organic laminate circuit carrier card. The assembly is then held at a bias temperature of about 150° C. and then chips are heated, preferably with Infra Red heat to a temperature of between about 200° to about 220° C. in a nitrogen gas environment. The assembly is then cooled and the chip is preferably encapsulated with an encapsulant, such as disclosed in U.S. Pat. No. 4,999,699 (Christie, et al.), the disclosure of which is incorporated herein by reference.

An advantage of this invention is the fact that the method is applicable for all levels of packaging, i.e., for highest level packaging, involving chip joining to motherboard as well. The processing is complete at this step, i.e., for 1st or 2nd level packaging. The module would now be ready for the next level of joining by SMT or other methods well known in the art could be employed.

This invention basically came about as an unexpected result which showed that low melting point metal that is deposited atop a reflowed solder mass alloys only with enough solder mass to form a volume of eutectic alloy. It was also found that relatively little or no further interdiffusion took place even after multiple times of eutectic melting cycles. Thus, a desired volume of eutectic liquid atop a solid solder mass is formed without any need for a barrier. A volume of eutectic liquid remains present, whenever the joint temperature is raised to eutectic temperature, even after joining on copper interconnections of circuit carrier; this liquid formation at the joint interface presents an ideal condition for easy removal of the joined chip for the purposes of chip replacement without mechanically or thermally affecting other components on the board.

The solder interconnection using solder balls having a cap of low melting point metal allow for making a low temperature chip attachment directly to any of the higher levels of packaging substrate is disclosed. After the solder ball has been formed using standard methods it is reflowed to give the solder ball a homogeneous alloy composition and a smooth surface. A layer of tin, preferably, pure tin, is deposited on the top of the solder balls. This structure results in localizing of the eutectic alloy, formed upon subsequent low temperature joining cycle, to the top of the high melting solder ball even after multiple low temperature reflow cycles. This method does not need tinning of the carrier or substrate to which the chip is to be joined, which makes this method economical. It has also been noticed that whenever temperature is raised slightly above the eutectic temperature, the structure always forms a liquid fillet around the joint with copper wires. This liquid fillet formation results in substantial thermal fatigue life improvement for reduced stress at interface; and secondly, provides an easy means to remove chip for the purpose of chip replacement and field repairs.

After the chip has been directly attached to the circuit carrier card to form the DCAM, the DCAM is now capable of joining to the next level of assembly, such as, by Surface Mount Technology (SMT).

These methods, techniques and metallurgical structures enables direct attachment of devices of any complexity to any substrate and to any level of packaging hierarchy; thereby, making the products more compact as well as more economical.

Referring now to FIGS. 1 through 5, where like reference numerals represent the same or similar parts throughout, FIG. 1, illustrates a cross-sectional view of a card 25, after a laminate 10, has gone through internal circuitization and lamination operations. Holes or openings 12, are drilled or punched or formed in the card 25. The card 25, could be selected from a circuit card or an organic laminate or an inorganic laminate or a flexible cable. The circuit card 25, has a first or an upper surface 14, for mounting for example of chips, and a second or lower surface 16, for mounting for example of SMT (Surface Mount Technology). At least one layer of copper 20, is formed, preferably, electroplated, on the upper and lower surfaces 14 and 16, of the card 25. This deposition of copper 20, also results in the formation of copper inside the opening 12, thus forming electrically continuous path between the upper and lower surfaces 14 and 16, respectively. In order to promote adhesion of the copper 20, to the laminate 10, preferably, a very thin layer of chromium 18, could be deposited over the upper surface 14, lower surface 16, and the walls of the opening 12, prior to the deposition of copper 20. Using standard photolithography, desired circuit patterns are chemically or electrochemically etched in the copper layer 20. The circuit patterns are formed or etched on both the upper and lower surface 14 and 16, respectively, of the card 25.

FIG. 2, shows a cross-sectional view of the circuit card 25, of FIG. 1, after the top surface 14, bottom surface 16, and the via hole 12, has been coated with at least one layer of insulator material 22. The insulator material 22, is preferably a photosensitive material. The insulator material 22, is screened on all the exposed surfaces of the card 25.

This screened circuit card 25, of FIG. 2, is then pre-baked at 80° C. The first side 14, is first pre-baked and then the second side 16, is pre-baked. This pre-baking plugs the holes 12, with the insulator material 22. The insulator material 22, not only acts as a plug for the hole 12, but also acts as a dam to prevent the lateral flow of solder into the openings 24 and 26, which will be discussed later in more detail.

Openings 24 and 26, are next formed in the insulator material 22. Basically, appropriate photo masks were aligned and exposed on both sides of the card 25, and developed using a developer, such as for example, sodium carbonate solution, thus creating openings 24, for the C4 solder ball 38, of an IC chip 30, on front or upper side and openings 26, for SMT connections onto the back or lower side of the card 25. Basically, opening 24, is made to allow the connection of a chip 30, shown in FIGS. 4 and 6, to the circuit card 25. While, opening 26, could be used to secure this circuit card 25, to a board or any other electronic device (not shown).

The pre-baked circuit card 25, is next cured at 150° C. This curing process expands the opening 24 and 26, to allow for the easy attachment of a solder ball from an IC chip to the card 25, and for SMT pad 36, as shown more clearly in FIG. 4. The upper surface 14, of the card 25, is next oxygen ashed at 130 mT pressure for about 30 minutes. This oxygen ashing roughens the surface of the card 25. This surface roughness improves the flowability of chip encapsulants which will be used later.

A thin layer of an easily oxidizable organic material can also be coated on the upper surface 14, to protect the surface of the copper 20, in the opening 24.

A solder paste, preferably, eutectic Pb-Sn solder paste, is next screened onto the second surface 16, to fill the SMT contact opening 26, to form solder pad 36. This is followed by Infra Red heating at a temperature of about 200° C. to reflow solder 36, to obtain a solder ball profile.

FIG. 3, illustrates the circuit card 25, after at least one eutectic solder coating 36, has been formed for the SMT pads.

For circuit cards 25, with SMT components already on one side (not shown), it is preferred that the eutectic solder paste is screened but not reflowed.

Figure 6:
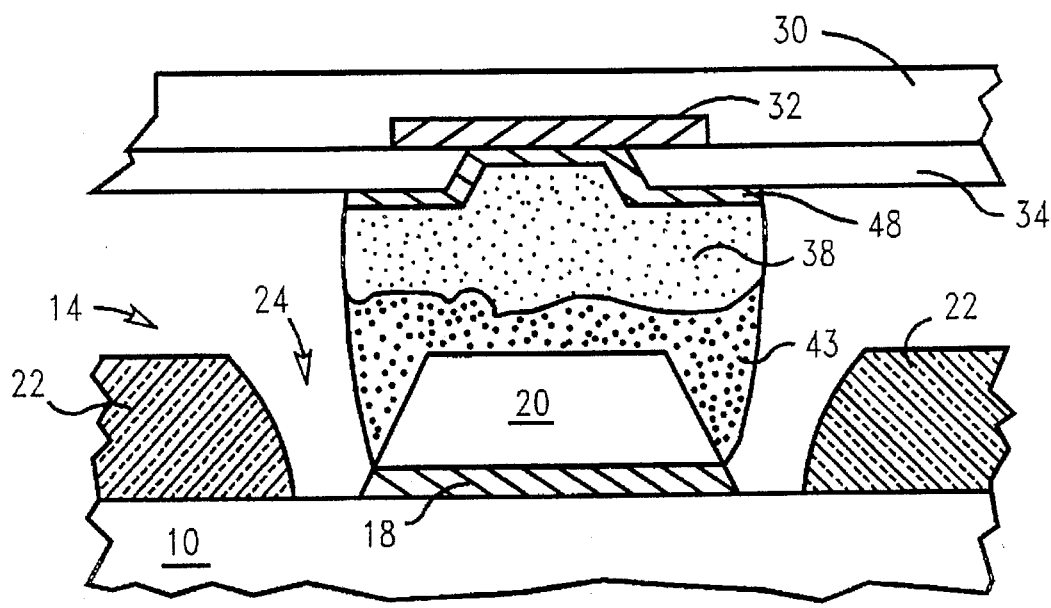
FIG. 6, is an enlarged cross-sectional view taken along A—A, from FIG. 4, after an IC chip having a cap of low melting point metal on a solder ball has been secured to the circuit card.

FIG. 4, illustrates a cross-sectional view of the inventive structure showing a Direct Chip Attached Module (DCAM) 50, where an IC chip 30, having low melting point metal capped solder balls has been directly joined to the circuit card 25, in a single step. While, FIG. 6, shows an enlarged cross-sectional view taken along A—A, from FIG. 4. The IC chip 30, having solder balls 38, with a low melting point metal cap are aligned onto the first surface 14, of the circuit card 25, using water soluble or no clean solder flux (not shown).

This assembly is then reflowed, preferably, in a belt type furnace. It is preferred that the belt speed and zone temperatures are adjusted so as to give a temperature profile where the DCAM 50, spends from about 3 to about 5 minutes above about 155° C.; and, between about 15 to about 75 seconds at a maximum temperature of about 190° C. to about 230° C. It should be noted that for lower maximum temperature a higher time is required at the maximum temperature.

During the heating cycle the low melting point metal cap 41, on the solder ball 38, alloys with the solder ball 38, to form eutectic composition which melts at 183° C. The volume of eutectic liquid is enough to envelope the exposed copper 20, and the surface tension of this eutectic liquid provides self aligning of the chip 30, to the exposed copper 20, on the circuit card 25. The reflow temperature cycle evaporates the protective layer, if any, and also the flux, and hence no post cleaning is required.

In order to protect the electrical connections between the chip 30, and the circuit card 25, suitable encapsulant can be provided under and over the chip 30, and cured. Some of the suitable encapsulants that can be used are disclosed in U.S. Pat. No. 4,999,699 (Christie, et al.), assigned to the assignee of the instant Patent Application and the disclosure of which is incorporated herein by reference. It has been found that the oxygen ashing step considerably improves the flow of the encapsulant under the chip 30. This encapsulant (not shown) primarily protects the electrical connection that is formed between the chip 30, and the card 25.

FIG. 5, is an enlarged cross-sectional view taken prior to the Joining of the IC chip 30, having the cap of low melting point metal 41, on the solder ball 38, to the circuit card 25. The solder ball 38, is secured to BLM 48. An internal metal wiring 32, provides the electrical communication from the chip 30, to the cap 41. The low melting point cap 41, is preferably selected from a group comprising of bismuth, indium, tin or alloys thereof. The solder ball 38, is selected from a group comprising of high melting point solder, low melting point solder or C4. And, whereas the material for the solder ball 38, is selected from a group comprising of Pb, Bi, In, Sn, Ag, Au, or alloys thereof. It should be noted that the preferred material for the cap 41, that is selected should be such that it forms a eutectic.

FIG. 6, is an enlarged cross-sectional view taken along A—A, from FIG. 4, after the IC chip 30, having the cap of low melting point metal 41, on the solder ball 38, has been secured to the circuit card 25. The cap 41, forms a eutectic 43, when it is reflowed and joins the solder ball 38, with the copper wiring 20.

Preferably, a layer of insulator 34, protects the surface of the chip 30. The solder ball 38, is preferably a high melting point solder ball, such as, for example, a solder ball with about 97 percent lead and about 3 percent tin, which is formed over the ball limiting metallurgy 48. The solder ball 38, could be formed either by evaporation or an electroplating methods of solder deposition. Before the inventive step of this invention is applied to the solder ball 38, it is preferred that all the processing steps of the semiconductor, such as, wafer testing, electrical testing have been completed and the solder has been re-flowed to bring it back to its spherical shape.

It should be apparent that the IC chip 30, could be a semiconductor wafer, wherein a plurality of devices (not shown) have been formed by conventional methods and interconnected through IC chip internal wires in one or more layers.

It should also be noted that the heat to the module 25 or 50, prior, during and after the joining process could be provided using at least one focused IR lamp (not shown in the figures).

To those skilled in the art, it should be obvious that the circuit carrier substrate 25, could be made of ceramic or organic material, in rigid or flexible form, with interlevel wiring (not shown) of one or more layers, and/or wiring channels on either or both surfaces (as shown).

EXAMPLES

The following examples are intended to further illustrate the invention and are not intended to limit the scope of the invention in any manner.

Example 1

An organic circuit carrier card 25, was processed to receive IC chip 30, per the process of this invention. The front or upper side of the card 25, was prepared to attach the chip 30, via C4 solder interconnection, while the lower or the back side of the card was prepared for joining to higher level packaging using SMT. The diameter of the hole 24, is preferably about 4 mil larger than the width of copper pads or lands 20, thereby allowing the eutectic 43, to flow on all sides of the copper pads 20, to give mechanical rigidity.

Example 2

In yet another embodiment of the invention, a motherboard containing printed circuits and none, one or more of IC chips and devices attached by any of the various methods enumerated in the Background of this invention, was employed. The openings in the copper wires of the printed circuit in motherboard was made during the board fabrication. The IC chip 30, with C4 solder balls 38, having tin cap 41, was aligned and joined to the copper pads 20, on the card 25, by using individual Infra Red heating as described above.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of making a device carrier for directly attaching a device having reflowed solder balls with low melting point metal cap, said method comprising the steps of:

(a) making at least one opening in a substrate, (b) depositing at least one electrically conductive metal on at least one surface of said substrate, and lining at least a portion of said opening with said at least one electrically conductive metal, (c) photolithographically defining a circuit pattern on at least a portion of said substrate, (d) forming said photolithographically defined circuit pattern on at least a portion of said substrate, (e) coating at least a portion of said substrate with at least one insulator material and filling said opening with said insulator material, (f) removing a portion of said insulator material and exposing a portion of said circuit pattern, and (g) joining a device having said reflowed solder balls with at least one low melting point metal cap to said exposed circuit pattern, such that at least a portion of said cap joins to a portion of said exposed circuit pattern.

2. The method of claim 1, wherein a portion of the surface of said insulator material after step (f) is roughened prior to any device attachment.

3. The method of claim 2, wherein said surface is roughened using oxygen plasma.

4. The method of claim 1, wherein said device carrier is selected from a group consisting of a rigid organic laminated card, a flexible organic laminated card, a rigid inorganic laminated card, a flexible inorganic laminated card or a ceramic substrate.

5. The method of claim 1, wherein said device carrier is selected from a group consisting of an interposer, a first level package, a second level package, or a mother board.

6. The method of claim 1, wherein a portion of said substrate is screened and reflowed using eutectic solder, and wherein said eutectic solder provides an electrical connection to a surface mount technology.

7. The method of claim 6, wherein the solder for said connection to a surface mount technology is deposited using a method selected from a group consisting of screening technique, solder injection technique, electroplating or electroless plating.

8. The method of claim 1, wherein said reflowed solder balls are selected from a group consisting of high melting point solder, low melting point solder or C4.

9. The method of claim 1, wherein said device is selected from a group consisting of organic substrate, multi-layer organic substrate, ceramic substrate, multi-layer ceramic substrate or an integrated circuit chip.

10. The method of claim 1, wherein said reflowed solder balls are on an electrically conductive portion of said device.

11. The method of claim 10, wherein the material for said electrically conductive portion is selected from a group consisting of Au, Co, Cr, Cu, Fe, Ni, TiW, phased Cr and Cu, and alloys thereof.

12. The method of claim 10, wherein said electrically conductive portion is in electrical contact with at least one internal electrically conductive portion.

13. The method of claim 1, wherein said reflowed solder balls comprise of a lead-tin alloy and wherein said alloy contains between about 2 percent to about 10 percent tin.

14. The method of claim 1, wherein said reflowed solder balls comprise of a lead-tin alloy and wherein said alloy contains between about 98 percent to about 70 percent lead.

15. The method of claim 1, wherein said reflowed solder balls are placed on said device using a method selected from the group consisting of evaporation, electroplating or solder injection method.

16. The method of claim 1, wherein said at least one low melting point metal cap is deposited on said reflowed solder balls by a method selected a group consisting of Radio Frequency evaporation, E-beam evaporation, electroplating, electroless plating or injection method.

17. The method of claim 1, wherein material for said at least one low melting point metal cap is selected from a group consisting of bismuth, indium, tin or alloys thereof.

18. The method of claim 1, wherein at least a portion of said capped solder ball is secured to an electrically conductive portion on said device carrier.

19. The method of claim 18, wherein material for said electrically conductive portion is selected from a group consisting of Au, Co, Cr, Cu, Fe, Ni, Ta, Ti, TiW, phased Cr and Cu, and alloys thereof.

20. The method of claim 18, wherein said device carrier is selected from a group consisting of organic circuit carrier or ceramic circuit carrier.

21. The method of claim 20, wherein said organic circuit carrier is selected from a group consisting of rigid organic circuit carrier or flexible organic circuit carrier.

22. The method of claim 21, wherein the material for said rigid organic circuit carrier is selected from a group consisting of epoxies.

23. The method of claim 1, wherein said low melting point metal cap, caps between about 10 percent to about 90 percent of the exposed surface of said solder ball, and preferably caps between about 20 percent to about 80 percent of the exposed surface of said solder ball, and more preferably caps between about 30 percent to about 50 percent of the exposed surface of said solder ball.

24. The method of claim 1, wherein said low melting point metal cap completely envelopes said solder ball.

25. The method of claim 1, wherein said device is selected from a group consisting of an IC chip, capacitor, resistor, a circuit carrier card, a power supply or an amplifying device.

26. The method of claim 1, where the thickness of said low melting point metal cap is chosen to provide a eutectic volume of between about 5 percent to about 40 percent of the volume of said solder ball, and preferably between about 10 percent to about 30 percent of the volume of said solder ball.

27. The method of claim 1, wherein the average thickness of said low melting point metal cap is between about 15 to about 50 micro-meters.

28. The method of claim 1, wherein said reflowed solder balls are selected from a group consisting of Pb, Bi, In, Sn, Ag, Au, or alloys thereof.

29. The method of claim 1, wherein maximum reflow temperature is between about 183° and about 230° C.

30. The method of claim 1, wherein reflow is above about 150° C. for between about 2 to about 5 minutes.

31. The method of claim 1, wherein the time at maximum temperature is between about 15 to about 75 seconds.

32. The method of claim 1, wherein reflow is performed in an environment selected from a group consisting of dry nitrogen, forming gas or hydrogen.

33. The method of claim 1, wherein heat is provided by at least one focused IR lamp.

34. The method of claim 1, wherein the step of joining a device, comprises the steps of:
 (a) aligning solder balls of said device with corresponding positions on said device carrier,
 (b) holding said device in place by surface tension afforded by solder flux, and
 (c) reflowing said solder balls to bond said device to said device carrier.

35. The method of claim 34, wherein said step of joining further comprises the step of encapsulating said device with at least one epoxy.

36. The method of claim 34, wherein said device is a semiconductor chip.

* * * * *